(12) United States Patent
Chen et al.

(10) Patent No.: US 10,343,898 B1
(45) Date of Patent: Jul. 9, 2019

(54) MEMS MICROPHONE WITH TUNABLE SENSITIVITY

(71) Applicant: Fortemedia, Inc., Santa Clara, CA (US)

(72) Inventors: Jien-Ming Chen, Tainan (TW); Nai-Hao Kuo, Tainan (TW); Wen-Shan Lin, Tainan (TW); Hsin-Li Lee, Tainan (TW)

(73) Assignee: FORTEMEDIA, INC., Santa Clara, CA (US)

( * ) Notice: Subject to any disclaimer, the term of this patent is extended or adjusted under 35 U.S.C. 154(b) by 0 days.

(21) Appl. No.: 16/025,074

(22) Filed: Jul. 2, 2018

Related U.S. Application Data (60) Provisional application No. 62/614,552, filed on Jan. 8, 2018.

(51) Int. Cl.
| | |
|---|---|
| *H04R 9/08* | (2006.01) |
| *B81B 7/02* | (2006.01) |
| *H04R 19/04* | (2006.01) |
| *H04R 19/00* | (2006.01) |
| *H04R 7/08* | (2006.01) |

(52) U.S. Cl.
CPC ............. *B81B 7/02* (2013.01); *H04R 7/08* (2013.01); *H04R 19/005* (2013.01); *H04R 19/04* (2013.01); *B81B 2201/0257* (2013.01); *B81B 2203/0127* (2013.01); *H04R 2201/003* (2013.01)

(58) Field of Classification Search
CPC .............................. H04R 19/005; H04R 19/04; H04R 2201/003; H04R 19/00; H04R 1/342; H04R 1/406; H04R 2499/11; H04R 2499/15; H04R 31/006; H04R 7/08; H04R 2924/1461; B81B 2201/0257; B81B 7/02; B81B 2203/0127
USPC ........ 381/111, 113, 174, 191, 355, 369, 122, 381/162, 26, 398; 257/416; 438/53
See application file for complete search history.

(56) References Cited

U.S. PATENT DOCUMENTS

| | | | |
|---|---|---|---|
| 8,934,649 B1 * | 1/2015 | Lee | H04R 19/005 381/174 |
| 9,078,069 B2 | 7/2015 | Bharatan et al. | |
| 9,462,389 B2 | 10/2016 | Wang | |
| 2012/0027235 A1 | 2/2012 | Chan et al. | |
| 2013/0177180 A1 | 7/2013 | Bharatan et al. | |
| 2014/0299948 A1 | 10/2014 | Wang et al. | |
| 2015/0189444 A1 * | 7/2015 | Pan | H04R 19/04 381/173 |
| 2015/0264465 A1 | 9/2015 | Bharatan et al. | |

(Continued)

*Primary Examiner* — Norman Yu
(74) *Attorney, Agent, or Firm* — McClure, Qualey & Rodack, LLP (57) ABSTRACT

A micro-electro-mechanical system (MEMS) microphone is provided. The MEMS microphone includes a substrate, a backplate, a diaphragm, a first insulating protrusion and a plurality of second insulating protrusions. The backplate is disposed on a side of the substrate. The diaphragm is disposed between the substrate and the backplate and is movable relative to the backplate. The first insulating protrusion and the second insulating protrusions are formed on the side of the backplate facing the diaphragm. The first insulating protrusion is connected to and affixed to the diaphragm permanently, and an air gap is formed between the diaphragm and each of the second insulating protrusions.

20 Claims, 11 Drawing Sheets

(56) References Cited

U.S. PATENT DOCUMENTS

| | | |
|---|---|---|
| 2015/0296305 A1 | 10/2015 | Shao et al. |
| 2016/0105748 A1 | 4/2016 | Pal et al. |
| 2016/0212542 A1* | 7/2016 | Wang .................... H04R 19/005 |
| 2017/0013363 A1* | 1/2017 | Berger ..................... H04R 7/20 |
| 2017/0026754 A1* | 1/2017 | Buck ........................ H04R 7/14 |

* cited by examiner

MEMS MICROPHONE WITH TUNABLE SENSITIVITY

CROSS REFERENCE TO RELATED APPLICATIONS

The present application claims priority of U.S. Provisional Patent Application No. 62/614,552, filed on Jan. 8, 2018, the entirety of which is incorporated by reference herein.

BACKGROUND OF THE INVENTION

Field of the Invention

The invention relates to an acoustic transducer, and more particularly to a micro-electro-mechanical system (MEMS) microphone.

Description of the Related Art

The current tendency is toward fabricating slim, compact, lightweight and high-performance electronic devices, including microphones. A microphone is used to receive sound waves and convert acoustic signal into electric signal. Microphones are widely used in daily life and are installed in such electronic products as telephones, mobiles phones, and recording pens. In a capacitive microphone, the variation of acoustic pressure (i.e. local pressure deviation from the ambient atmospheric pressure caused by sound waves) forces the diaphragm to deform correspondingly, and the deformation of the diaphragm induces a capacitance variation. The variation of acoustic pressure of the sound waves can thus be obtained by detecting the voltage difference caused by the capacitance variation.

This is distinct from the conventional electret condenser microphones (ECM), in which mechanical and electronic elements of micro-electro-mechanical system (MEMS) microphones can be integrated on a semiconductor material using integrated circuit (IC) technology to fabricate a miniaturized microphone. MEMS microphones have advantages such as a compact size, being lightweight, and having low power consumption, and they have therefore entered the mainstream of miniaturized microphones.

Although existing MEMS microphones have generally been adequate for their intended purposes, they have not been entirely satisfactory in all respects. For example, the compatible acoustic pressure range (i.e. dynamic range) of detectable sound waves in a MEMS microphone still needs improvement. The dynamic range is related to the highest compatible acoustic pressure (i.e. acoustic overload point, which is referred to hereinafter as the "AOP"), which is determined by the harmonic distortion rate (total harmonic distortion, which is referred to hereinafter as the "THD") of the MEMS microphone. On the other hand, if the diaphragm has a lower elastic modulus (i.e. lower stiffness), it can be used to sense a smaller acoustic pressure (i.e. have higher sensitivity), but the THD of the diaphragm will be sacrificed accordingly (i.e. the AOP will be reduced). Therefore, it cannot achieve high AOP and high sensitivity, simultaneously, of a MEMS microphone (i.e. unable to achieve a wider dynamic range).

BRIEF SUMMARY OF THE INVENTION

In view of the aforementioned problems, an object of the invention is to provide a MEMS microphone that can achieve high AOP and high sensitivity simultaneously.

An embodiment of the invention provides a MEMS microphone. The MEMS microphone includes a substrate, a backplate, a diaphragm, a first insulating protrusion and a plurality of second insulating protrusions. The backplate is disposed on a side of the substrate. The diaphragm is disposed between the substrate and the backplate and is movable relative to the backplate. The first insulating protrusion and the second insulating protrusions are formed on the side of the backplate facing the diaphragm. The first insulating protrusion is connected to and affixed to the diaphragm permanently, and an air gap is formed between the diaphragm and each of the second insulating protrusions.

In some embodiments, the first insulating protrusion is located in a center region of the diaphragm, and the second insulating protrusions are located in an annular region of the diaphragm surrounding the center region.

In some embodiments, the second insulating protrusions are annular protrusions arranged in concentric circles.

In some embodiments, the protrusion height of the second insulating protrusions gradually decreases from a location where the second insulating protrusion is close to the center region of the diaphragm to a location where the second insulating protrusion is close to an outer edge of the annular region of the diaphragm.

In some embodiments, the second insulating protrusions are individual island-shaped protrusions arranged in concentric circles.

In some embodiments, the diaphragm includes a plurality of long apertures arranged in concentric circles, the long apertures of adjacent circles being arranged alternately, configured to adjust the stiffness of the diaphragm.

In some embodiments, the MEMS microphone further includes a dielectric layer disposed between the substrate and the diaphragm and between the diaphragm and the backplate, configured to clamp a peripheral portion of the diaphragm. The long apertures of the diaphragm are located close to the dielectric layer.

In some embodiments, the diaphragm includes at least one vent hole configured to allow sound waves to pass through.

In some embodiments, the diaphragm includes at least one vent valve configured to allow sound waves to pass through. The vent valve has an open area that is variable in response to a change in acoustic pressure of the sound waves passing through the vent valve.

In some embodiments, the diaphragm includes at least one vent hole and at least one vent valve configured to allow sound waves to pass through. The vent valve has an open area that is variable in response to a change in acoustic pressure of the sound waves passing through the vent valve.

In some embodiments, the backplate has a recess formed on a second side of the backplate opposite to the first side and corresponding to the first insulating protrusion. A protection layer is provided to cover the recess.

In some embodiments, the protection layer comprises conductive material.

In some embodiments, the first insulating protrusion is a solid column connecting the backplate and the center of the diaphragm.

In some embodiments, the first insulating protrusion is a hollow column connecting the backplate and the center of the diaphragm.

In some embodiments, the diaphragm includes a vent hole having a fixed open area configured to allow sound waves to pass through. The vent hole is aligned with a hollow portion of the hollow column.

In some embodiments, the diaphragm includes a vent valve having a variable open area configured to allow sound waves to pass through. The vent valve is aligned with a hollow portion of the hollow column.

In some embodiments, the backplate includes a conductive layer and an insulating layer covering the conductive layer. The conductive layer and the insulating layer are respectively located on the first side and a second side of the backplate opposite to the first side. The first insulating protrusion and the second insulating protrusions are integrally formed with the insulating layer and protrude toward the diaphragm.

In some embodiments, the insulating layer of the backplate includes a first insulating layer and a second insulating layer stacked on the first insulating layer.

In some embodiments, the MEMS microphone further includes an additional insulating layer connected between the first insulating protrusion and the diaphragm.

In order to illustrate the purposes, features, and advantages of the invention, the preferred embodiments and drawings of the invention are shown in detail as follows.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

In the following detailed description, the orientations of "on", "above", "under", and "below" are used for representing the relationship between the relative positions of each element as illustrated in the drawings, and are not meant to limit the invention. Moreover, the formation of a first element on or above a second element in the description that follows may include embodiments in which the first and second elements are formed in direct contact, or the first and second elements have one or more additional elements formed therebetween.

In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the sake of simplicity and clarity. Furthermore, some elements not shown or described in the embodiments have the forms known by persons skilled in the field of the invention.

In the present disclosure, a micro-electro-mechanical system (MEMS) microphone for detecting sound waves and converting the sound waves (acoustic signal) into electric signal is provided, in accordance with various exemplary embodiments. In particular, the MEMS microphones in the various embodiments can achieve high AOP (i.e. achieve a wider dynamic range) and high sensitivity simultaneously via the following described features. The variations of some embodiments are discussed. Throughout the various views and illustrative embodiments, like reference numbers are used to designate like elements.

Figure 1:
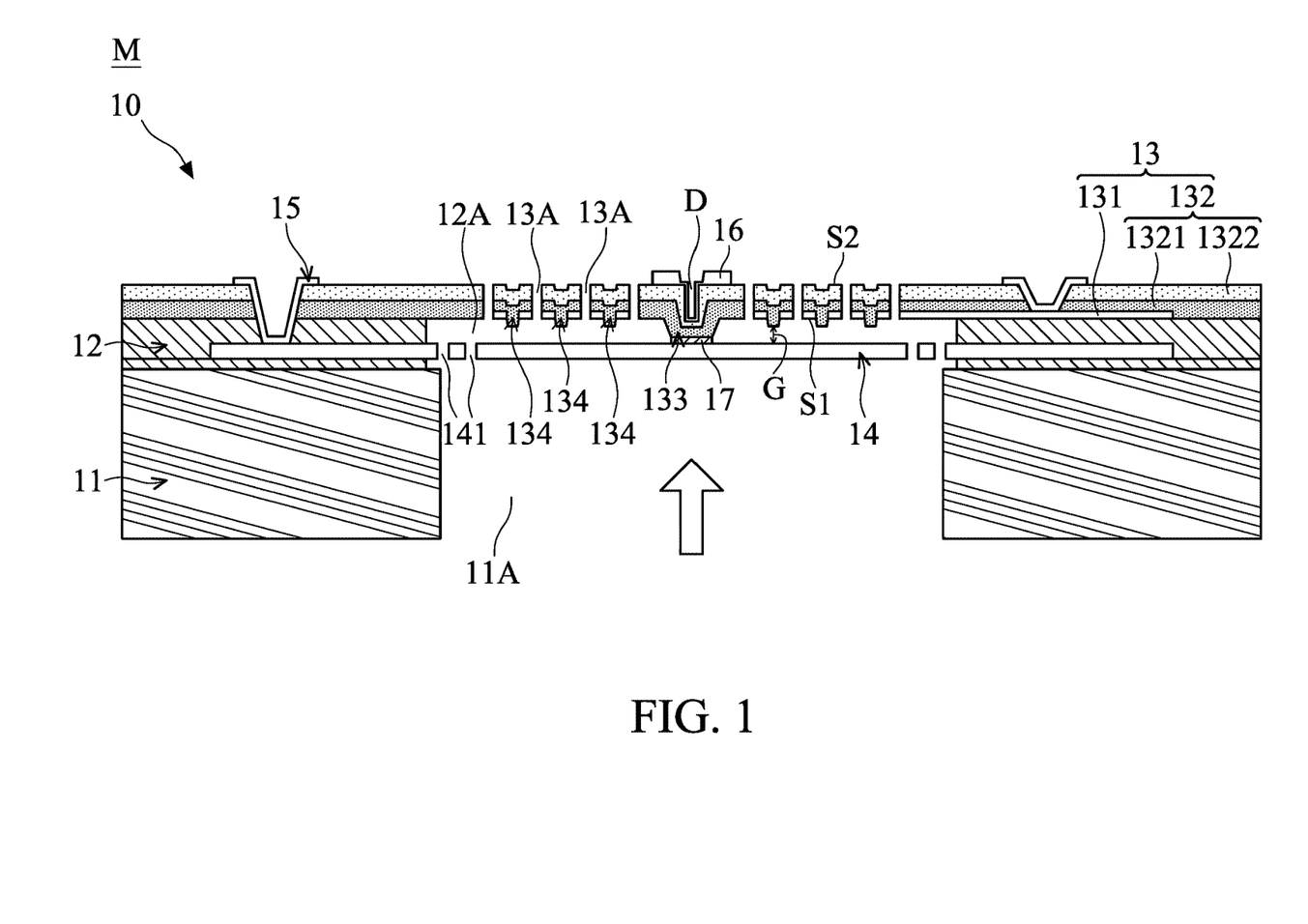
FIG. 1 schematically illustrates a cross-sectional view of a MEMS microphone, in accordance with some embodiments.

FIG. 1 schematically illustrates a cross-sectional view of a MEMS microphone M, in accordance with some embodiments. It should be noted that the MEMS microphone M depicted in FIG. 1 has been simplified for the sake of clarity to better understand the inventive concepts of the present disclosure. Additional features can be added into the MEMS microphone M, and some of the features described below can be replaced or eliminated in other embodiments of the MEMS microphone M. As shown in FIG. 1, the MEMS microphone M which is a capacitive microphone includes a MEMS structure 10 including a substrate 11, a dielectric layer 12, a backplate 13, a diaphragm 14, and an electrode layer 15.

The substrate 11 is configured to support the dielectric layer 12, the backplate 13, the diaphragm 14, and the electrode layer 15 on a side thereof. The substrate 11 may have an opening portion 11A which allows sound waves (e.g., as the arrow indicated in FIG. 1) received by the MEMS microphone M to pass through and/or enter the MEMS structure 10. The substrate 11 may be made of silicon or the like.

The dielectric layer 12 is disposed between the substrate 11 and the diaphragm 14, and between the diaphragm 14 and the backplate 13, so as to provide partial isolation between the substrate 11, the diaphragm 14, and the backplate 13 from each other. Moreover, the dielectric layer 12 is disposed around the backplate 13 and the diaphragm 14, such that the backplate 13 and the diaphragm 14 are clamped at their edges by the dielectric layer 12. Furthermore, the dielectric layer 12 may have an opening portion 12A corresponding to the opening portion 11A of the substrate 11, so as to allow the sound waves to pass through the diaphragm 14 and the backplate 13 and then leave the MEMS structure 10. The dielectric layer 12 may be made of silicon oxide or the like.

The backplate 13 is a stationary element disposed on a side of the substrate 11. The backplate 13 may have sufficient stiffness such that it would not be bent or movable when the sound waves pass through the backplate 13. In some embodiments, the backplate 13 is a stiff perforated element including a number of acoustic holes 13A each passing through the backplate 13, as shown in FIG. 1. The acoustic holes 13A are configured to allow the sound waves to pass through.

In some embodiments, the backplate 13 includes a conductive layer 131 and an insulating layer 132 covering the conductive layer 131 for protection, as shown in FIG. 1. The conductive layer 131 and the insulating layer 132 are respectively located on a first side S1 of the backplate 13 facing the diaphragm 14 and a second side S2 of the backplate 13 opposite to the first side S1. The conductive layer 131 may be made of poly-silicon or the like, and the insulating layer 132 may be made of silicon nitride or the like.

In some embodiments, the MEMS structure 10 is electrically connected to a circuit (not shown) via several electrode pads of the electrode layer 15 that is disposed on the backplate 13 and electrically connected to the conductive layer 131 and the diaphragm 14. In some embodiments, the electrode layer 15 comprises copper, silver, gold, aluminum, or alloy thereof.

The diaphragm 14 is movable or displaceable relative to the backplate 13. The diaphragm 14 is configured to sense the sound waves received by the MEMS microphone M.

The displacement change of the diaphragm 14 relative to the backplate 13 causes a capacitance change between the diaphragm 14 and the backplate 13. The capacitance change is then converted into an electric signal by a circuitry connected with the diaphragm 14 and the backplate 13, and the electrical signal is sent out of the MEMS microphone M through the electrode layer 15.

In some embodiments, a first insulating protrusion 133 is provided or formed on the first side S1 of the backplate 13 facing the diaphragm 14, and the first insulating protrusion 133 is connected to and affixed to the diaphragm 14 permanently, as shown in FIG. 1. In some embodiments, the first insulating protrusion 133 is integrally formed with the insulating layer 132 and protrudes toward the diaphragm 14. The first insulating protrusion 133 may be a solid column connecting the backplate 13 and (e.g. the center of) the diaphragm 14, so that the first insulating protrusion 133 supports the diaphragm 14 to increase stiffness of the diaphragm 14, thereby increasing the AOP of the MEMS Microphone M.

In some embodiments, an additional insulating layer 17 is also provided and connected between the first insulating protrusion 133 and the diaphragm 14, as shown in FIG. 1. The additional insulating layer 17 may include the same material as the dielectric layer 12 or another insulating material. However, the additional insulating layer 17 can be omitted in different embodiments.

On the other hand, in order to increase the sensitivity of the diaphragm 14, a number of long apertures 141 may be provided in the diaphragm 14. In some embodiments, the long apertures 141 in the diaphragm 14 are arranged in concentric circles close to the dielectric layer 12 (e.g., between the conductive layer 131 of the backplate 13 and the dielectric layer 12) and the long apertures of adjacent circles are arranged alternately (see FIGS. 1 and 2A), so that the long apertures 141 can serve as a spring in the diaphragm 14 to reduce the stiffness of the diaphragm 14. In some alternative embodiments, the number of concentric circles formed by the long apertures 141 may be more than two. With this structural feature, high sensitivity of the MEMS microphone M can be achieved.

In addition, the long apertures 141 in the diaphragm 14 are also configured to relieve the stress on the diaphragm 14.

In some embodiments, a number of second insulating protrusions 134 are also provided or formed on the first side S1 of the backplate 13, and an air gap G is formed between the diaphragm 14 and each of the second insulating protrusions 134, as shown in FIG. 1. In addition, the air gap G between the diaphragm 14 and each of the second insulating protrusions 134 may be the same (but not limited thereto).

Figure 2A:
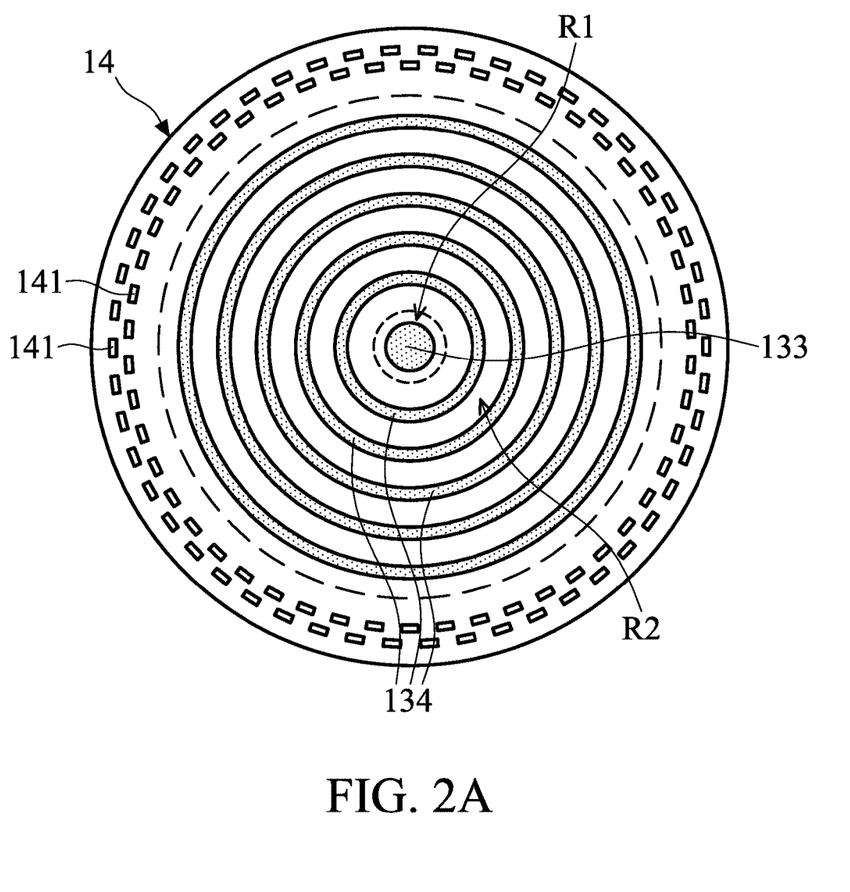
FIG. 2A schematically illustrates the arrangement of the diaphragm, the first insulating protrusion and the second insulating protrusions in FIG. 1 from another viewing angle, in accordance with some embodiments.
Figure 2B:
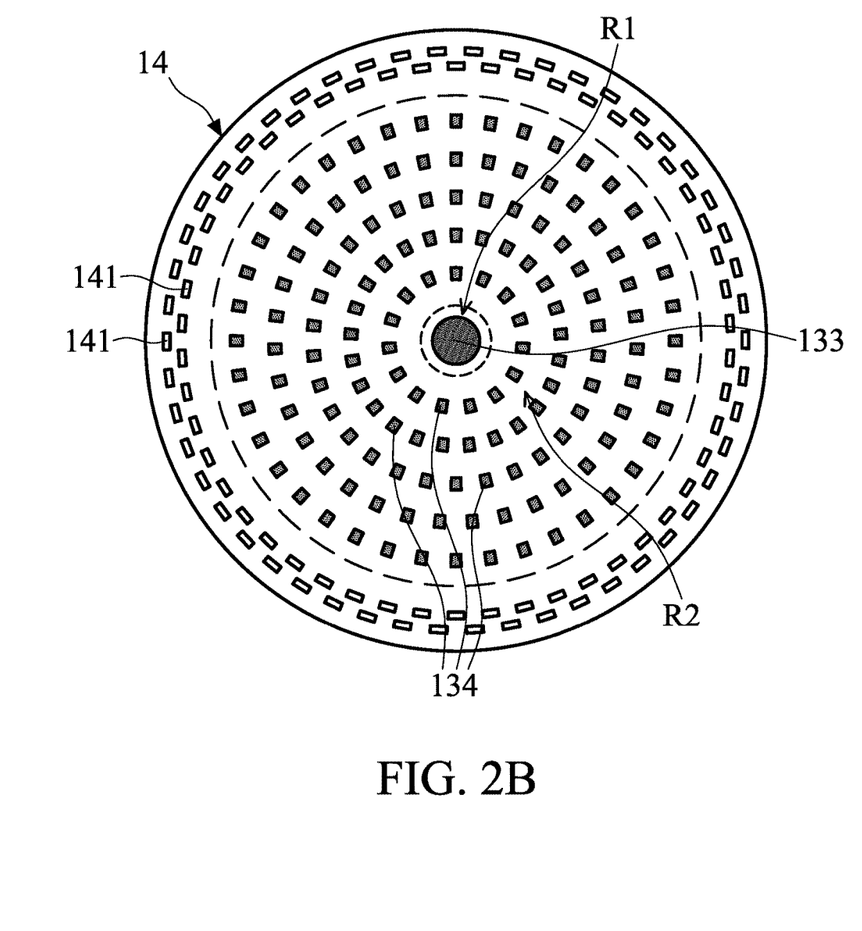
FIG. 2B schematically illustrates the arrangement of the diaphragm, the first insulating protrusion and the second insulating protrusions in FIG. 1 from another viewing angle, in accordance with some embodiments.

FIGS. 2A and 2B schematically illustrate the arrangement of the diaphragm 14, the first insulating protrusion 133 and the second insulating protrusions 134 in FIG. 1 from another viewing angle, in accordance with some embodiments. As shown, the first insulating protrusion 133 may be located in a center region R1 of the circular diaphragm 14, and the second insulating protrusions may be located in an annular region R2 of the diaphragm 14 surrounding the center region R1. In addition, the second insulating protrusions 134 may be annular protrusions arranged in concentric circles (FIG. 2A), or the second insulating protrusions 134 may be individual island-shaped protrusions arranged in concentric circles (FIG. 2B). However, it should be appreciated that many variations and modifications can be made to the embodiments of the disclosure.

Referring to FIG. 1, to form the first insulating protrusion 133 and the second insulating protrusions 134, the insulating layer 132 of the backplate 13 may include a first insulating layer 1321 and a second insulating layer 1322 stacked on the first insulating layer 1321. In some embodiments, the first and second insulating layers 1321 and 1322 may comprise the same material or different material. In some embodiments, a protection layer 16 is provided to cover a recess D that is formed on the second side S2 and corresponding to the first insulating protrusion. The protection layer 16 may comprise conductive material (e.g., aluminum) or another material.

Figure 3:
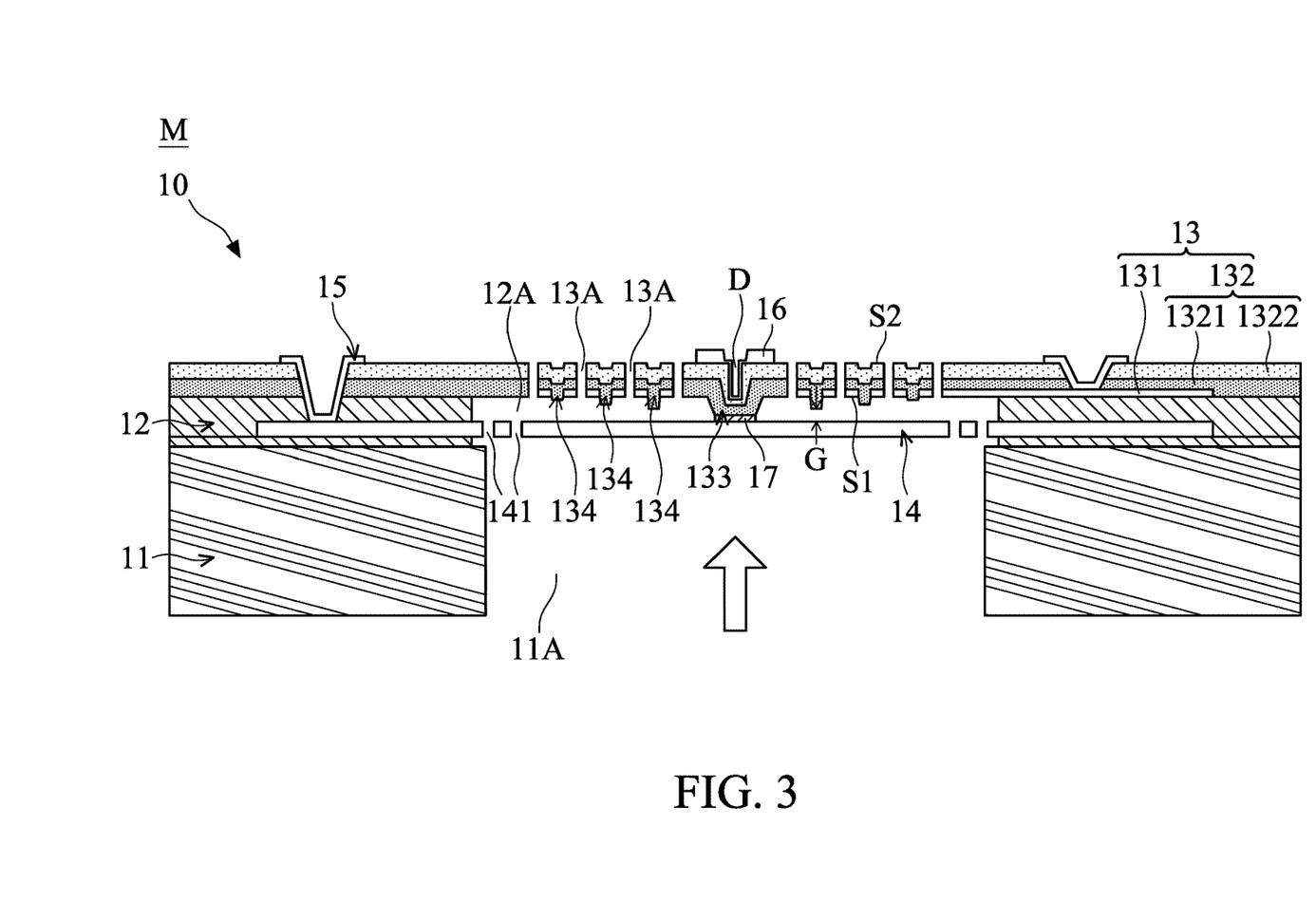
FIG. 3 schematically illustrates a cross-sectional view of a MEMS microphone, in accordance with some embodiments.

FIG. 3 schematically illustrates a cross-sectional view of a MEMS microphone M, in accordance with some other embodiments. The MEMS microphone M in FIG. 3 differs from the embodiments of the MEMS microphone M in FIGS. 1, 2A and 2B in that the protrusion height of the second insulating protrusions 134 (may be annular protrusions or individual island-shaped protrusions) gradually decreases from the location where the second insulating protrusion 134 is close to the center region R1 (FIGS. 2A and 2B) of the diaphragm 14 to the location where the second insulating protrusion 134 is close to the outer edge of the annular region R2 (FIGS. 2A and 2B) of the diaphragm 14.

With these structural features, when a predetermined voltage is applied via the electrode layer 15, the conductive layer 131 of the backplate 13 and the diaphragm 14 would close to each other. More specifically, when a voltage greater than the predetermined volt (V) is applied between the backplate 13 and the diaphragm 14, the portion of the annular region R2 of the diaphragm 14 begins to move toward the second insulating protrusions 134; and when the applied voltage gradually increases, the portion of the annular region R2 of the diaphragm 14 will successively come into contact with the second insulating protrusions 134 with different protrusion heights. Therefore, the portion of the diaphragm 14 that is displaceable relative to the backplate 13 (i.e. the portion that is not affixed to the backplate 13) may be controllably chosen or adjusted, so that the sensitivity of the diaphragm 14 of the MEMS microphone M is tunable by adjusting the affixed range. The fixed state of the portion of the annular region R2 of the diaphragm 14 can be cancelled when the voltage application is cancelled.

Figure 4:
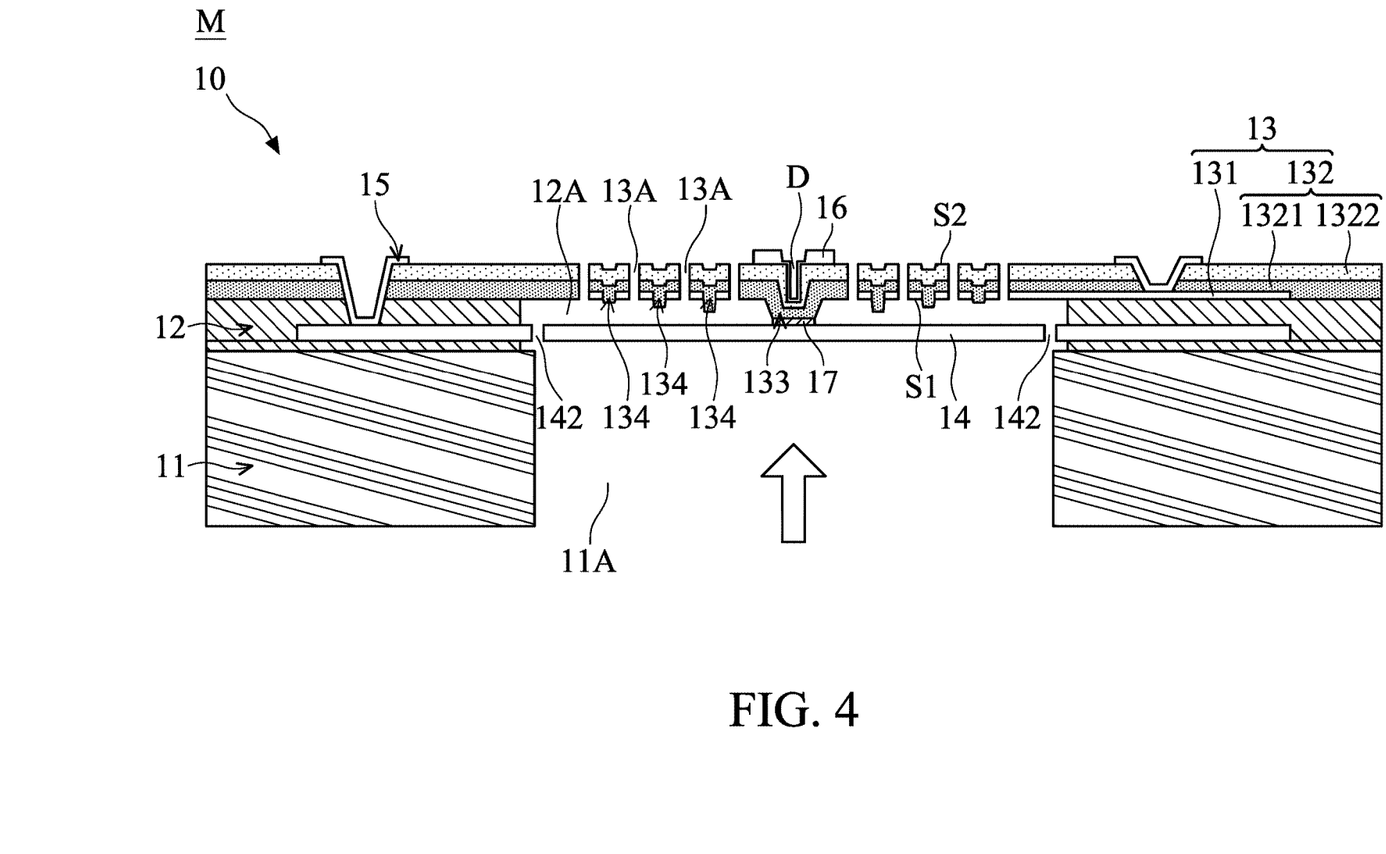
FIG. 4 schematically illustrates a cross-sectional view of a MEMS microphone, in accordance with some embodiments.
Figure 5:
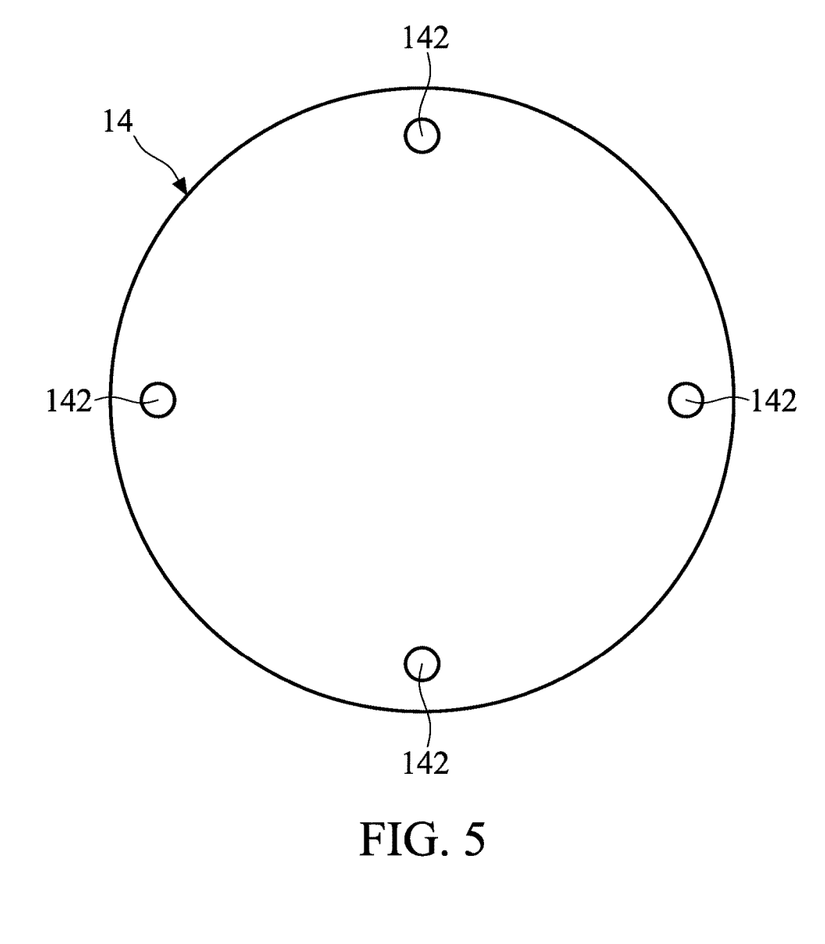
FIG. 5 schematically illustrates the arrangement of the vent holes in the diaphragm in FIG. 4 from another viewing angle, in accordance with some embodiments.

FIG. 4 schematically illustrates a cross-sectional view of a MEMS microphone M, in accordance with some other embodiments. As shown, the long apertures 141 (FIGS. 1 to 3) in the diaphragm 14 of the MEMS microphone M are replaced by a number of vent holes 142. FIG. 5 schematically illustrates the arrangement of the vent holes 142 in the diaphragm 14 in FIG. 4 from another viewing angle, in accordance with some embodiments. As shown, four circular vent holes 142 are formed in the diaphragm 14. However, it should be appreciated that many variations and modifications can be made to the embodiments of the disclosure.

Figure 6:
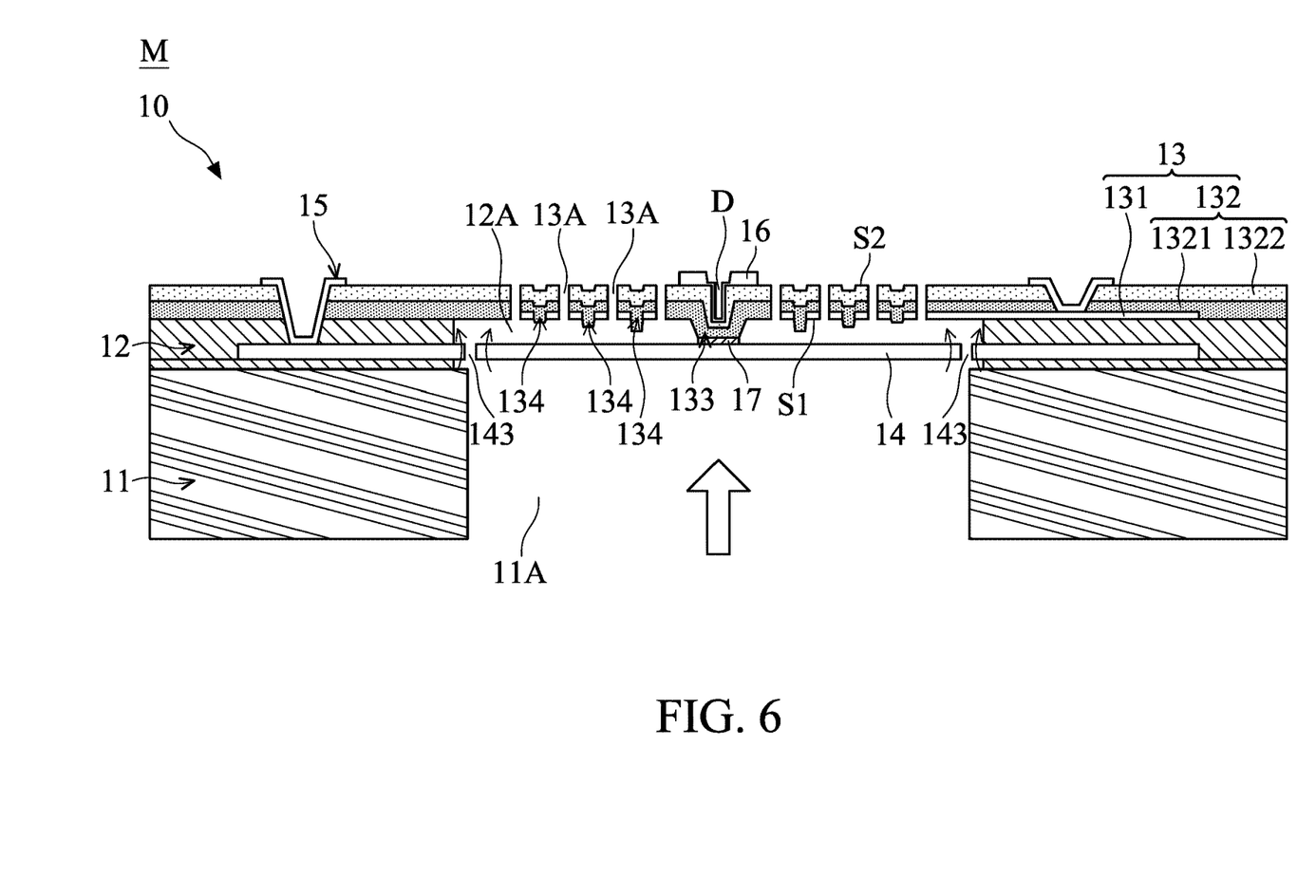
FIG. 6 schematically illustrates a cross-sectional view of a MEMS microphone, in accordance with some embodiments.

FIG. 6 schematically illustrates a cross-sectional view of a MEMS microphone M, in accordance with some other embodiments. As shown, the MEMS microphone M in FIG. 6 differs from the MEMS microphone M in FIG. 4 in that the diaphragm 14 further includes a number of vent valves 143.

Figure 7A:
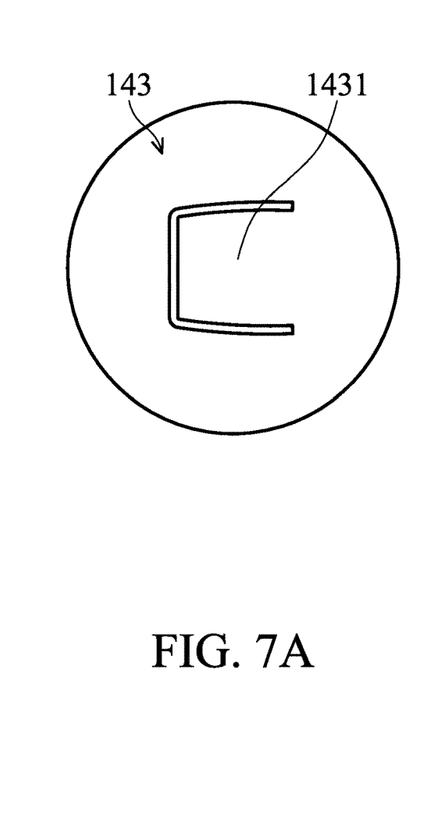
FIG. 7A schematically illustrates the shape of the vent valve in the diaphragm in FIG. 5 from another viewing angle, in accordance with some embodiments.
Figure 7B:
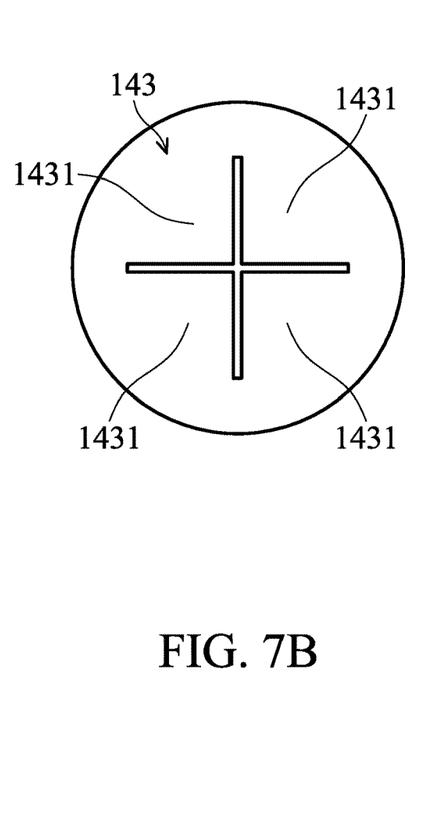
FIG. 7B schematically illustrates the shape of the vent valve in the diaphragm in FIG. 5 from another viewing angle, in accordance with some embodiments.
Figure 7C:
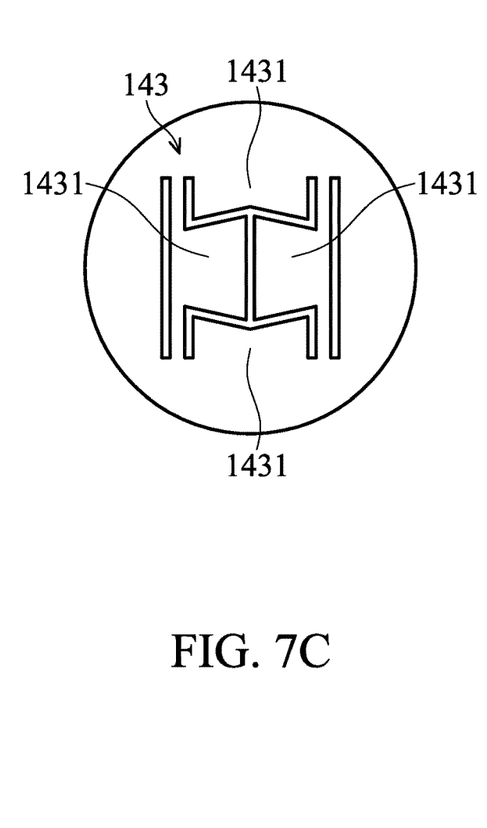
FIG. 7C schematically illustrates the shape of the vent valve in the diaphragm in FIG. 5 from another viewing angle, in accordance with some embodiments.

The vent valves 143 each have an open area that is variable in response to a change in the acoustic pressure of the sound waves passing therethrough. More specifically, the vent valve 143 includes at least one deflection portion 1431 (FIGS. 7A to 7C), and the deflection portion 1431 is deflectable (as the arrows indicated in FIG. 6) relative to the main body of the diaphragm 14, in response to a change in the acoustic pressure of the sound waves impinging on the diaphragm 14. FIGS. 7A to 7C schematically illustrates various shapes of the vent valve 143 in the diaphragm 14 in FIG. 5 from another viewing angle, in accordance with some embodiments. As shown, the deflection portion(s) 1431 of the vent valve 143 may be in rectangular (FIG. 7A), fan-shaped (FIG. 7B) or polygonal (FIG. 7C). However, it should be appreciated that many variations and modifications can be made to the embodiments of the disclosure.

Figure 8:
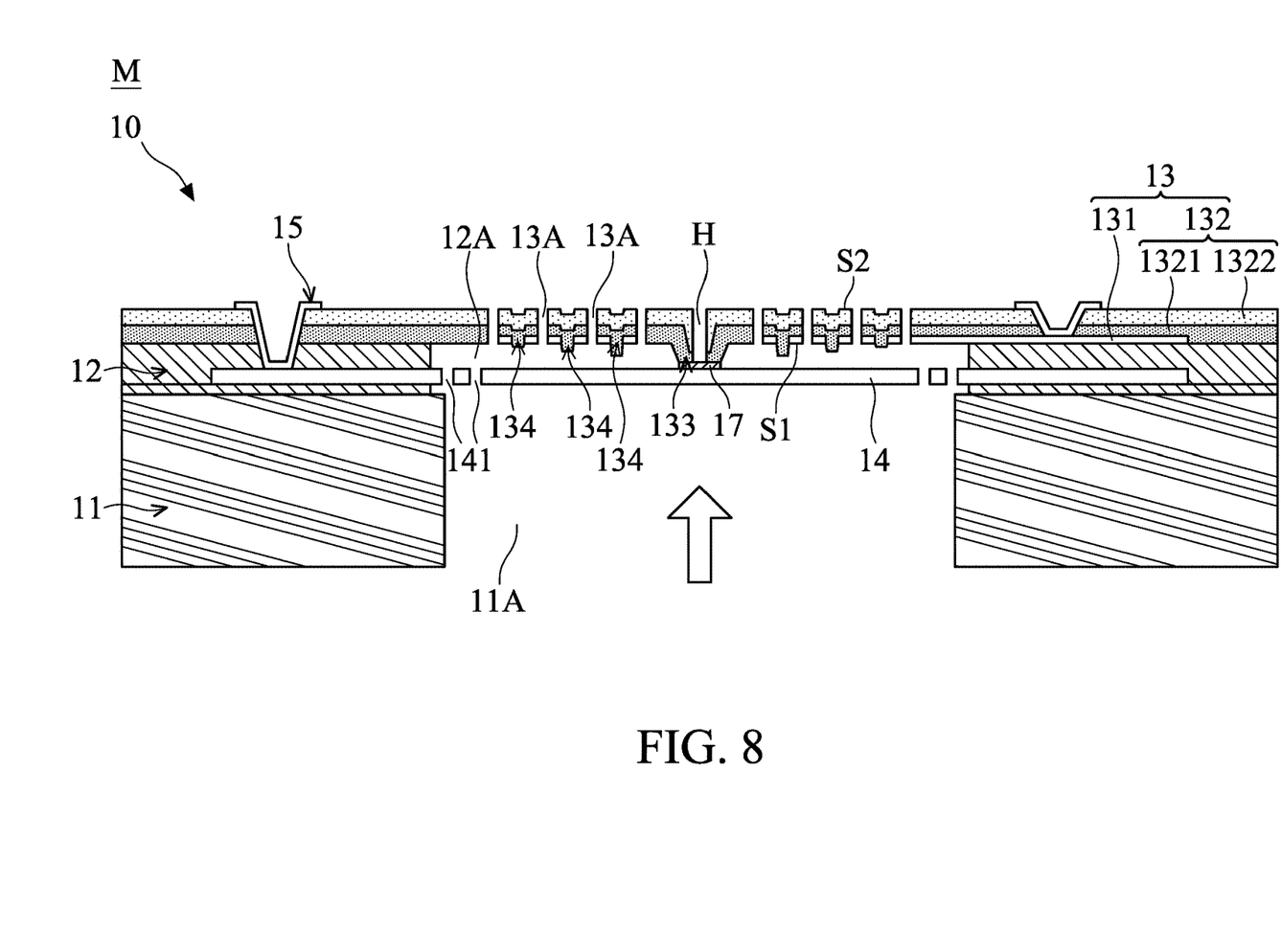
FIG. 8 schematically illustrates a cross-sectional view of a MEMS microphone, in accordance with some embodiments.

FIG. 8 schematically illustrates a cross-sectional view of a MEMS microphone M, in accordance with some other embodiments. As shown, the MEMS microphone M in FIG. 8 differs from the MEMS microphone M in FIGS. 1, 2A and 2B in that the first insulating protrusion 133 is a hollow column having a hollow portion H therein, and the protection layer 16 is omitted. This hollow first insulating protrusion 133 connects the backplate 13 and (e.g. the center of) the diaphragm 14 to reduce unexpected deformation of the diaphragm 14 like as solid insulating protrusion 133 in FIG. 1.

Figure 9:
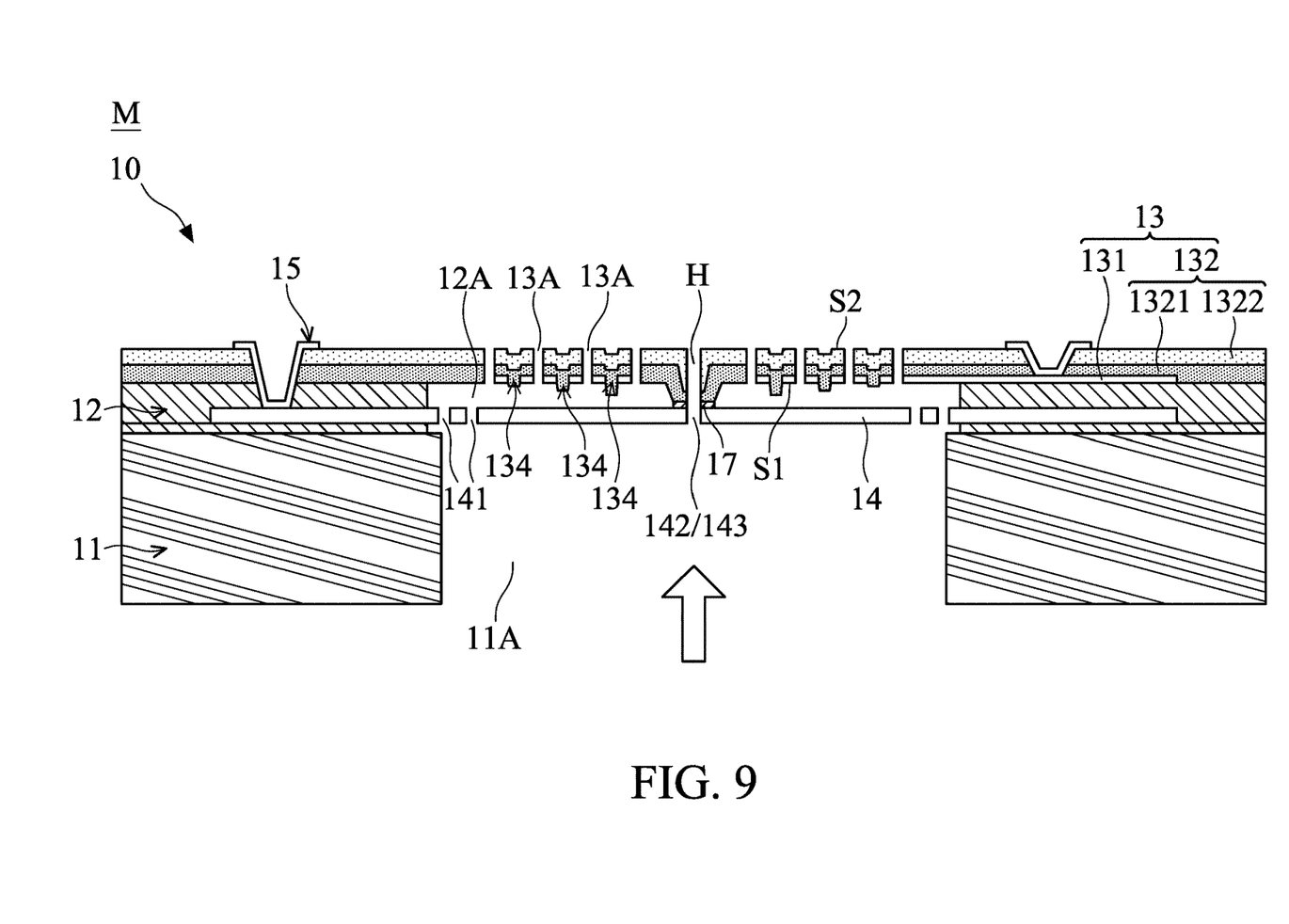
FIG. 9 schematically illustrates a cross-sectional view of a MEMS microphone, in accordance with some embodiments.

FIG. 9 schematically illustrates a cross-sectional view of a MEMS microphone M, in accordance with some other embodiments. As shown, the MEMS microphone M in FIG. 9 differs from the MEMS microphone M in FIG. 8 in that the diaphragm 14 further includes a vent hole 142 or a vent valve 143 aligned with the hollow portion H in the first insulating protrusion 133.

Figure 10:
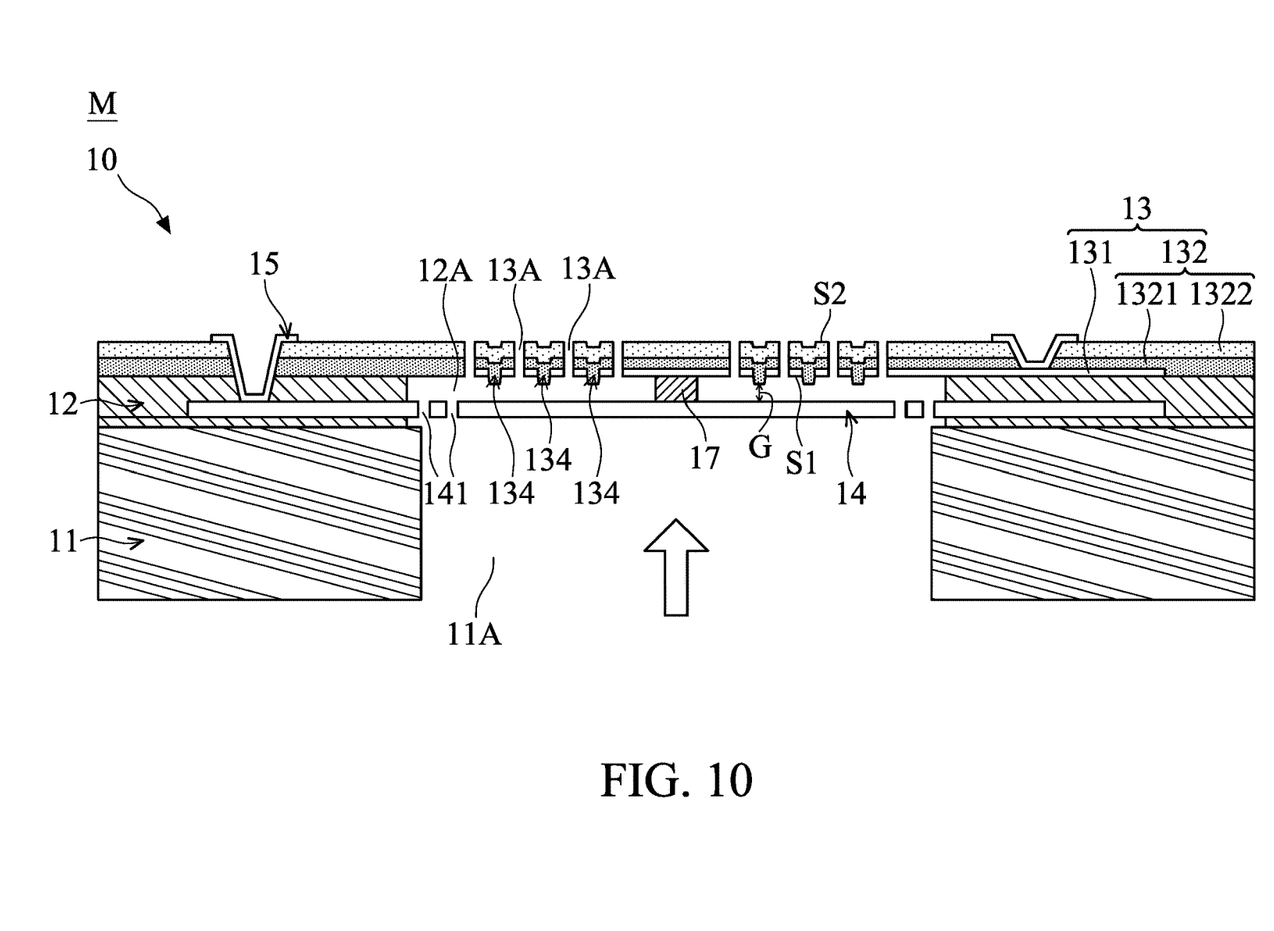
FIG. 10 schematically illustrates a cross-sectional view of a MEMS microphone, in accordance with some embodiments.

The embodiments of the present disclosure have some advantageous features. By disposing at least one first insulating protrusion between the backplate and the diaphragm to connect and support the center region of the diaphragm, unexpected deformation of the diaphragm during the displacement of the diaphragm is reduced, thereby increasing the AOP of the diaphragm. However, in some embodiments as shown in FIG. 10, the first insulating protrusion (e.g., the first insulating protrusion 133 depicted in FIGS. 1-4, 6, and 8-9) can also be omitted, and the additional insulating layer 17 described above is provided and connected between the first side S1 of the backplate 13 and the diaphragm 14 to support the center region of the diaphragm and increase the AOP of the diaphragm.

Moreover, some long apertures may be provided in the diaphragm and arranged in concentric circles to serve as a spring in the diaphragm (in some alternative embodiments, the long apertures may also be replaced by several vent holes and/or vent valves) to reduce the diaphragm stiffness thereof, thereby increasing the sensitivity of the diaphragm. Consequently, the provided MEMS microphone can achieve high AOP and high sensitivity simultaneously.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A micro-electro-mechanical system (MEMS) microphone, comprising:
    a substrate;
    a backplate disposed on a side of the substrate;
    a diaphragm disposed between the substrate and the backplate and movable relative to the backplate; and
    a first insulating protrusion and a plurality of second insulating protrusions extending from a first side of the backplate facing the diaphragm, wherein the first insulating protrusion is fixedly connected to the diaphragm, and an air gap is formed between the diaphragm and each of the second insulating protrusions;
    wherein the diaphragm includes a plurality of long apertures arranged in concentric circles and configured to adjust a stiffness of the diaphragm, wherein each of the long apertures communicates with an upper surface and a lower surface of the diaphragm, and the long apertures of adjacent circles are arranged in a staggered manner.

2. The MEMS microphone as claimed in claim 1, wherein the first insulating protrusion is located in a center region of the diaphragm, and the second insulating protrusions are located in an annular region of the diaphragm surrounding the center region.

3. The MEMS microphone as claimed in claim 2, wherein the second insulating protrusions are annular protrusions arranged in concentric circles.

4. The MEMS microphone as claimed in claim 3, wherein a protrusion height of the second insulating protrusions gradually decreases from a location where the second insulating protrusion is close to the center region of the diaphragm to a location where the second insulating protrusion is close to an outer edge of the annular region of the diaphragm.

5. The MEMS microphone as claimed in claim 2, wherein the second insulating protrusions are individual island-shaped protrusions arranged in concentric circles.

6. The MEMS microphone as claimed in claim 5, wherein a protrusion height of the second insulating protrusions gradually decreases from a location where the second insulating protrusion is close to the center region of the diaphragm to a location where the second insulating protrusion is close to an outer edge of the annular region of the diaphragm.

7. The MEMS microphone as claimed in claim 1, further comprising a dielectric layer disposed between the substrate and the diaphragm and between the diaphragm and the backplate, configured to clamp a peripheral portion of the diaphragm, and the long apertures of the diaphragm are located close to the dielectric layer.

8. The MEMS microphone as claimed in claim 1, wherein the diaphragm includes at least one vent hole configured to allow sound waves to pass through.

9. The MEMS microphone as claimed in claim 1, wherein the diaphragm includes at least one vent valve configured to allow sound waves to pass through, and the at least one vent valve has an open area that is variable in response to a change in acoustic pressure of the sound waves passing through the at least one vent valve.

10. The MEMS microphone as claimed in claim 1, wherein the diaphragm includes at least one vent hole and at least one vent valve configured to allow sound waves to pass through, and the at least one vent valve has an open area that is variable in response to a change in acoustic pressure of the sound waves passing through the at least one vent valve.

11. The MEMS microphone as claimed in claim 1, wherein the backplate has a recess formed on a second side of the backplate opposite to the first side and corresponding to the first insulating protrusion, and a protection layer is provided to cover the recess.

12. The MEMS microphone as claimed in claim 11, wherein the protection layer comprises conductive material.

13. The MEMS microphone as claimed in claim 1, wherein the first insulating protrusion is a solid column connecting the backplate and a center of the diaphragm.

14. The MEMS microphone as claimed in claim 1, wherein the first insulating protrusion is a hollow column connecting the backplate and a center of the diaphragm.

15. The MEMS microphone as claimed in claim 14, wherein the diaphragm includes a vent hole having a fixed open area configured to allow sound waves to pass through, and the vent hole is aligned with a hollow portion of the hollow column.

16. The MEMS microphone as claimed in claim 14, wherein the diaphragm includes a vent valve having a variable open area configured to allow sound waves to pass through, and the vent valve is aligned with a hollow portion of the hollow column.

17. The MEMS microphone as claimed in claim 1, wherein the backplate includes a conductive layer and an insulating layer covering the conductive layer, and the conductive layer and the insulating layer are respectively located on the first side and a second side of the backplate opposite to the first side, and wherein the first insulating protrusion and the second insulating protrusions are integrally formed with the insulating layer and protrude toward the diaphragm.

18. The MEMS microphone as claimed in claim 17, wherein the insulating layer of the backplate includes a first insulating layer and a second insulating layer stacked on the first insulating layer.

19. The MEMS microphone as claimed in claim 1, further comprising an additional insulating layer connected between the first insulating protrusion and the diaphragm.

20. A micro-electro-mechanical system (MEMS) microphone, comprising:
   a substrate;
   a backplate disposed on a side of the substrate;
   a diaphragm disposed between the substrate and the backplate and movable relative to the backplate; and
   a first insulating protrusion and a plurality of second insulating protrusions extending from a first side of the backplate facing the diaphragm, wherein the first insulating protrusion is fixedly connected to the diaphragm, and an air gap is formed between the diaphragm and each of the second insulating protrusions;
   wherein the backplate has a recess formed on a second side of the backplate opposite to the first side and corresponding to the first insulating protrusion, and a protection layer is filled into the recess.

* * * * *